United States Patent [19]

Saw et al.

[11] Patent Number: 5,345,450

[45] Date of Patent: Sep. 6, 1994

[54] METHOD OF COMPRESSING AND DECOMPRESSING SIMULATION DATA FOR GENERATING A TEST PROGRAM FOR TESTING A LOGIC DEVICE

[75] Inventors: Beng I. Saw; Marcus V. Tai; Dai M. Le, all of San Jose, Calif.

[73] Assignee: VLSI Technology, Inc., San Jose, Calif.

[21] Appl. No.: 38,740

[22] Filed: Mar. 26, 1993

[51] Int. Cl.$^5$ .................. G06F 11/00; G01R 31/28
[52] U.S. Cl. .......................... 371/27; 371/23
[58] Field of Search ............ 371/27, 23, 25.1; 395/500; 364/264.3

[56] References Cited

U.S. PATENT DOCUMENTS

| | | | |
|---|---|---|---|
| 4,433,414 | 2/1984 | Carey | 371/27 |
| 4,652,814 | 3/1987 | Groves et al. | 324/73 R |
| 4,682,330 | 7/1987 | Millham | 371/27 |
| 4,899,273 | 2/1990 | Omoda et al. | 364/200 |
| 4,982,361 | 1/1991 | Miyaoka et al. | 364/900 |
| 5,046,033 | 9/1991 | Andreason et al. | 364/580 |
| 5,051,941 | 9/1991 | Jakamire et al. | 364/578 |
| 5,095,262 | 3/1992 | Henley et al. | 371/27 |
| 5,151,903 | 9/1992 | Mydill et al. | 371/27 |

OTHER PUBLICATIONS

Finnel, Tom E. "In Circuit Testing of LSI Bused PCB's" Electronic Production, Sep. 1988 pp. 47–53.
Gulati et al "An Efficient Compaction Algorithm for Test Vectors of Microprocessors and Microcontrollers" 1988 IEEE pp. 378–381.

Primary Examiner—Robert W. Beausoliel, Jr.
Assistant Examiner—Joseph E. Palys
Attorney, Agent, or Firm—Majestic, Parsons, Siebert & Hsue

[57] ABSTRACT

A method for simulating a logic device is described wherein a sequence of input vectors to a computer simulation is reduced in order to save computational time and data storage requirements when the sequence includes a series of redundant input vectors having the same expected output vectors. The method reduces the number of redundant input vectors to be applied to the computer simulation by eliminating all but the first input vector of series while encoding a plurality of control bits associated with that input vector with information indicating the number of redundant input vectors being eliminated. Subsequently, after the simulation of the logic device, the output vectors resulting from the simulation are combined with their respective input vectors to form a set of test vectors. Using the encoded information in the first input vector of the series of redundant input vectors, the thus generated set of test vectors is then expanded to form an expanded set of test vectors suitable for generating a test program for testing the logic device on a logic device tester.

7 Claims, 6 Drawing Sheets

|    | INPUT VECTOR | | | | OUTPUT VECTOR | | |
|----|------|------|------|------|------|------|------|
|    | 201" | 202" | 203" | 204" | 301" | 302" | 303" |
| t0 | 1 | 0 | 1 | 1 | 0 | 1 | 0 |
| t1 | 1 | 1 | 0 | 1 | 1 | 0 | 0 |
| t2 | 0 | 1 | 0 | 1 | 1 | 1 | 0 |
| t3 | 1 | 0 | 0 | 1 | 0 | 1 | 0 |
| t4 | 1 | 1 | 1 | 1 | 1 | 0 | 1 |
| t5 | 1 | 1 | 1 | 1 | 1 | 0 | 1 |
| t6 | 1 | 1 | 1 | 1 | 1 | 0 | 1 |
| t7 | 1 | 1 | 1 | 1 | 1 | 0 | 1 |
| t8 | 0 | 1 | 0 | 0 | 1 | 1 | 0 |

| | INPUT VECTOR | | | | CONTROL BITS | | OUTPUT VECTOR | | |
|---|---|---|---|---|---|---|---|---|---|
| | 201" | 202" | 203" | 204" | CB1 | CB2 | 301" | 302" | 303" |
| t0 | 1 | 0 | 1 | 1 | 0 | 0 | 0 | 1 | 0 |
| t1 | 1 | 1 | 0 | 1 | 0 | 0 | 1 | 0 | 0 |
| t2 | 0 | 1 | 0 | 1 | 0 | 0 | 1 | 1 | 0 |
| t3 | 1 | 0 | 0 | 1 | 0 | 0 | 0 | 1 | 0 |
| t4 | 1 | 1 | 1 | 1 | 1 | 0 | 1 | 0 | 1 |
| t5 | 0 | 1 | 0 | 0 | 0 | 0 | 1 | 1 | 0 |

METHOD OF COMPRESSING AND DECOMPRESSING SIMULATION DATA FOR GENERATING A TEST PROGRAM FOR TESTING A LOGIC DEVICE

BACKGROUND OF THE INVENTION

This invention relates in general to techniques for simulating logic devices and generating test programs for testing those devices from data resulting from such simulations and in particular, to a technique for compressing simulations of logic devices to reduce the run time and data storage requirements for those simulations, and subsequently decompressing data resulting from those simulations and generating test programs for testing the logic devices from the decompressed data.

Figure 1:
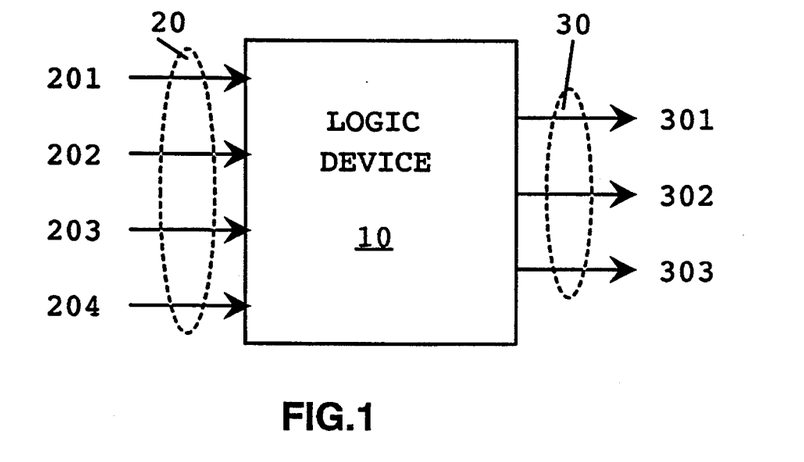
FIG. 1 illustrates an example of a logic device.

FIG. 1 illustrates an example of a logic device 10 having a plurality of inputs 20 and a plurality of outputs 30. Although there are no restrictions on the number or arrangement of the inputs or outputs to the logic device 10, for descriptive purposes the plurality of inputs 20 is shown in the figure to include four inputs 201–204 entering on one side of the logic device 10 and the plurality of outputs 30 is shown to include three outputs 301–303 exiting on the opposite side of the logic device 10.

The logic device 10 comprises digital circuitry which responds to electrical signals received through the plurality of inputs 20 by processing those signals at a speed determined by a supplied clock signal (not shown), and generating electrical signals in response thereof which are then transmitted through the plurality of outputs 30. The maximum speed at which the digital circuitry can operate is generally determined by the process technology used in fabricating the device.

Figure 2:
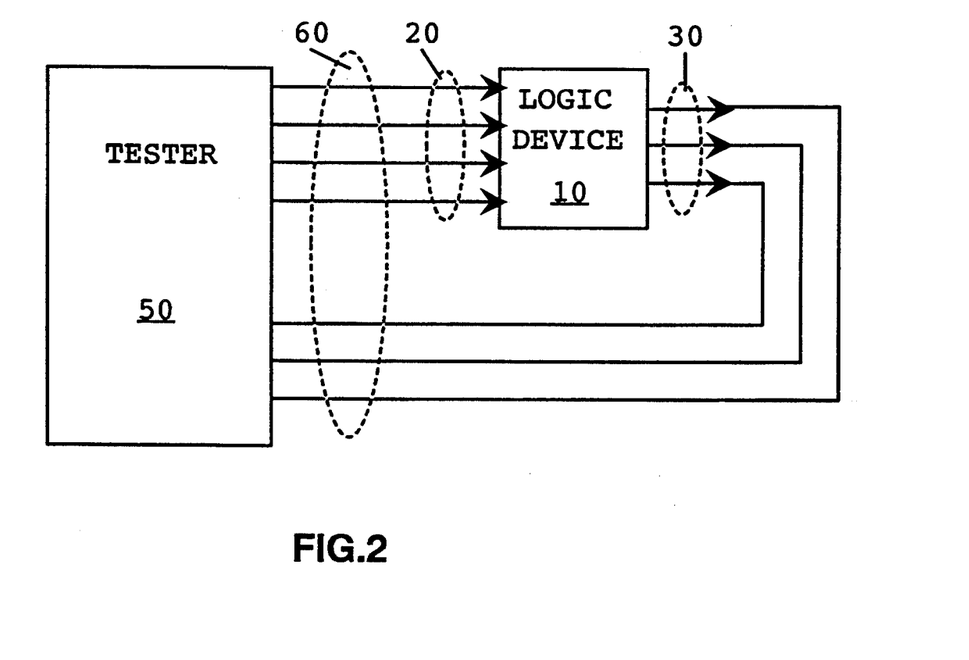
FIG. 2 illustrates an example of a test configuration for testing the logic device of FIG. 1.

FIG. 2 illustrates an example of a test configuration for testing the logic device 10. The logic device 10 is tested by a logic device tester 50 having a plurality of test channels 60. Some of the test channels 60 are connected to the plurality of inputs 20 of the logic device 10 to provide stimuli to the logic device 10, and some of the plurality of test channels 60 are connected to the plurality of outputs 30 of the logic device 10 to receive the responses of the logic device 10 to the provided stimuli.

A test program being executed on the logic device tester 50 is provided with a sequence of test vectors particular to the logic device 10 for testing the logic device 10. Each test vector includes a set of input values (also referred to herein as an "Input Vector") which are simultaneously applied across the inputs 20 of the logic device 10, and a set of expected output values (also referred to herein as an "Output Vector") which are expected to be simultaneously detected across the outputs 30 of the logic device 10 in response to the set of input values.

When testing the logic device 10, the logic device tester 50 sequentially applies each input vector across the inputs 20 of the logic device 10, detects each set of output values across the outputs 30 of the logic device 10 in response to each input vector applied, and compares the detected set of output values against the expected output values corresponding to the input vector being applied at that time by the logic device tester 50. When a detected output value on any one of the outputs 30 does not match its corresponding expected output value, the logic device tester 50 determines that the logic device 10 has failed. The speed at which the logic device tester 50 sequentially applies each of the input vectors across the inputs 20 of the logic device 10 is typically selected to be less than the maximum clock frequency of the logic device 10.

Figure 3:
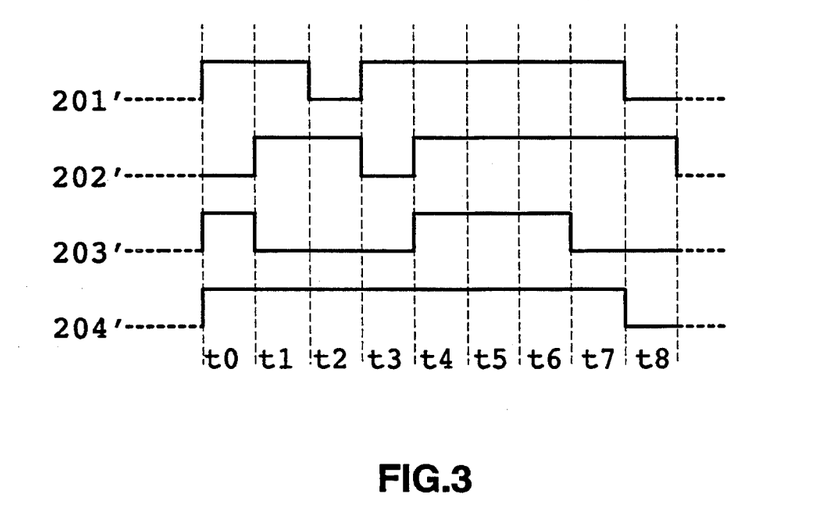
FIG. 3 illustrates an example of a sequence of bit patterns to be applied to the inputs of the logic device of FIG. 1 when testing the device with the test configuration of FIG. 2.

FIG. 3 illustrates an example of sequential input vectors being applied to the inputs 20 of the logic device 10. In a first input vector corresponding to time t0, signal 201' indicates that a HIGH logic level ("1") voltage is being applied to the input 201, signal 202' indicates that a LOW logic level ("0") voltage is being applied to the input 202, signal 203' indicates that a HIGH logic level voltage is being applied to the input 203, and signal 204' indicates that a HIGH logic level voltage is being applied to the input 204. Other input vectors corresponding to times t1 through t8 are also shown.

Figure 4:
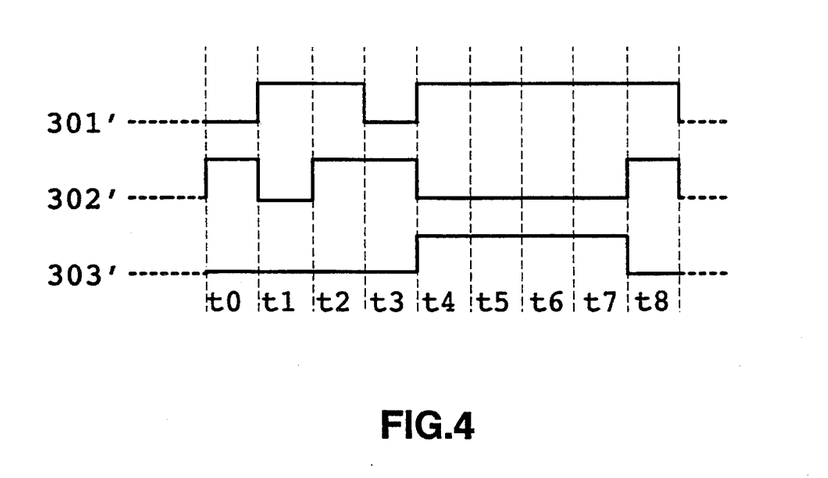
FIG. 4 illustrates an example of a sequence of bit patterns detected on the outputs of the logic device of FIG. 1, in response to the sequence of bit patterns applied to the inputs of the logic device as shown in FIG. 3.

FIG. 4 illustrates an example of output values being detected on outputs 30 of the logic device 10 by the logic device tester 50 in response to the applied input vectors of FIG. 3. In a first set of detected output values corresponding to the input vector being applied at time t0, signal 301' indicates that a LOW logic level voltage is being detected on output 301, signal 302' indicates that a HIGH logic level voltage is being detected on output 302, and signal 303' indicates that a LOW logic level voltage is being detected on output 303. Other sets of detected output values corresponding to the input vectors being applied at times t1 through t8 are also shown.

Figure 5:
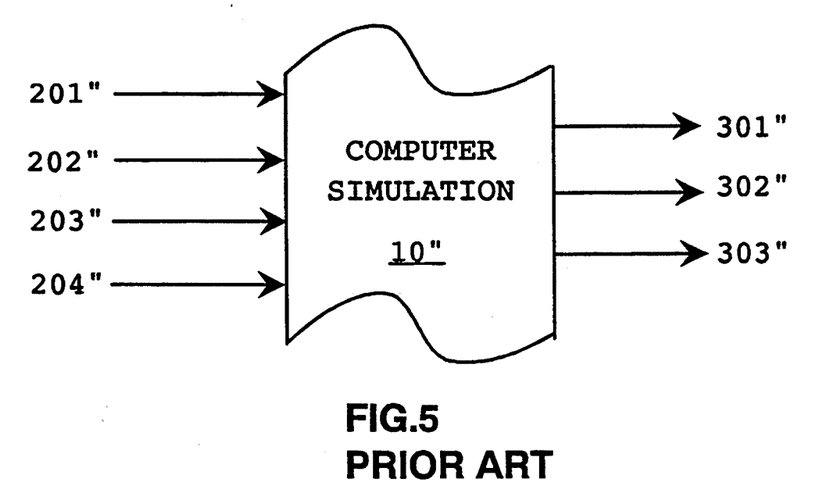
FIG. 5 schematically illustrates an example of how expected output values are determined from a computer simulation of the logic device of FIG. 1.

In order to determine whether the logic device 10 has failed or not, the logic device tester 50 needs to compare each detected output value with a corresponding expected output value for that output in response to the input vector being applied at that time. FIG. 5 schematically illustrates how the expected output values are obtained. Simulated versions (e.g., 201''–204'') of the input signals (e.g., 201'–204' in FIG. 3) are provided to a computer program 10'' which simulates the logic device 10. The computer generated outputs (e.g., 302''–303'') are then tabulated and corresponding values of the simulated inputs (e.g., 201''–204'') are combined with their computer generated outputs (e.g., 301''–303'') to form a test vector for each of the simulated time periods (e.g., t0, t1, t2, etc.).

Figure 6:
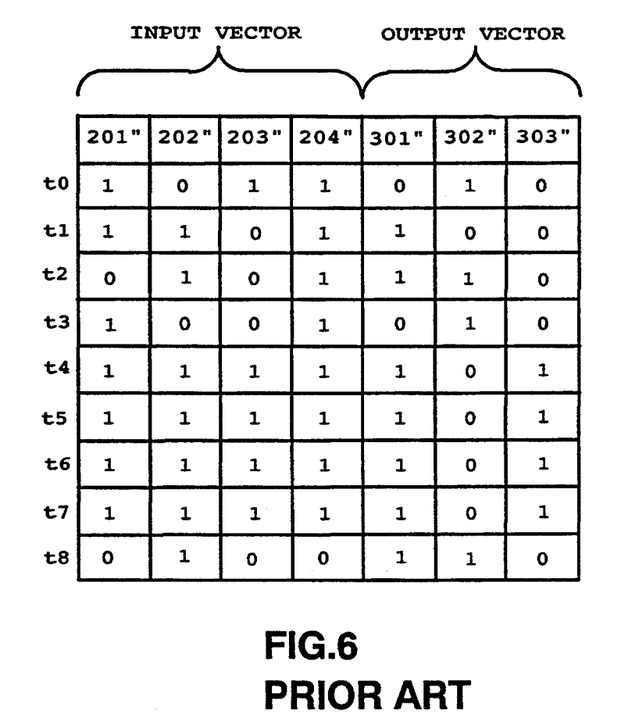
FIG. 6 illustrates, as examples, some test vectors resulting from the computer simulation schematically illustrated in FIG. 5.

FIG. 6 illustrates, as an example, a tabulation of test vectors (also referred to herein as "simulation data") for the first nine simulated time periods (e.g., t0 through t8) of the computer simulation described in reference to FIGS. 3–5. For the first nine simulated time periods, it is assumed for descriptive purposes that the expected output values, 301''–303'', are equal to the actual detected output values, 301'–303'.

OBJECTS AND SUMMARY OF THE INVENTION

The present invention is based upon the observation that simulation time on the computer is wasted while functionally simulating a series of redundant input vectors which in turn, generate a series of redundant output vectors, for example, such as those shown in time periods t4–t7 of FIG. 6. Further, the incremental data stored as a result of simulating such a series of redundant test vectors is itself redundant and consequently, wasteful.

Accordingly, one object of the present invention is to reduce the simulation time and the data storage requirements required to simulate a logic device having a series of redundant test vectors, while generating sufficient simulation data to automatically generate a test program from the simulation data.

These and additional objects are accomplished by the various aspects of the present invention, wherein briefly stated, one aspect of the invention is a method of reducing the simulation time and data storage requirements for a computer simulation of a logic device, comprising the steps of: selecting an initial operating frequency for a logic device tester; selecting a sequence of input vectors to be applied to the logic device inputs by the logic device tester for testing the logic device, wherein each input vector is to be applied for a finite duration equal to a period corresponding to the initial operating frequency, before a next input vector in the sequence is applied; associating a plurality of control bits with each of the sequence of input vectors; locating a series of redundant input vectors among the sequence of input vectors, wherein each input vector in the series is expected to generate an identical output vector on the logic device's outputs; forming a subset to be provided to the computer simulation, of the sequence of input vectors by eliminating from the sequence all but a first input vector of the located series of redundant input vectors; and encoding a plurality of control bits associated with the first input vector of the located series.

The encoding scheme for the encoding of the plurality of control bits can be such that it indicates either the number of redundant input vectors being eliminated, or as in the preferred embodiment, the type of activity being conducted while the series of redundant input vectors are being applied to the inputs of the logic device by the tester. It also may as in the preferred embodiment of the invention, include information which causes a program which generates a test program for the tester to change the operating frequency of the logic device tester while the tester is applying input vectors from a series of redundant test vectors to the inputs of the logic device.

Another aspect of the present invention is a method of generating a test program from test vectors generated from the computer simulation utilizing the previously described aspects of the present invention. The method comprises the steps of: reading and decoding the control bits associated with each of the test vectors, to locate the first input vector of the series of redundant input vectors; and forming an expanded set of test vectors by duplicating the first input vector a predetermined number of times, wherein the expanded set of test vectors is then used to generate the test program.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

A series of redundant test vectors such as those shown in time periods t4-t7 of FIG. 6, may result, for example, when the logic device tester 50 is programming an electrically programmable read-only-memory embedded among logic or other digital circuitry in the logic device 10, in order to test the electrically programmable read-only-memory portion. The series of redundant test vectors result, because the programming of one location in an electrically programmable read-only-memory generally takes considerably more time than the normal cycle time between successive test vectors being applied to the inputs of the logic device 10 by the logic device tester 50.

For example, to test the logic portions of the logic device 10, a typical operating frequency for the logic device tester 50 might be 1.0 MHz., which is equivalent to a clock cycle or period of 1.0 $\mu$sec. Consequently, the logic device tester 50 applies on every such clock cycle (e.g., at 1.0 $\mu$sec. intervals), an input vector from the sequence of test vectors, to the inputs (e.g., 201-204) of the logic device 10, to test the logic portions of the logic device 10.

The programming of one location in an electrically programmable read-only-memory may take, however, considerably more time than 1.0 $\mu$sec. For example, an electrically programmable read-only-memory incorporating the ViaLink TM process jointly developed between QuickLogic, Inc. and VLSI Technology, Inc. requires approximately 25.0 milliseconds to program one memory location. During this time period, 25,000 redundant input vectors may be applied by the logic device tester 50 across the inputs 20 of the logic device 10, and in response to these 25,000 redundant input vectors, 25,000 redundant sets of output values may be generated across the outputs 30 of the logic device 10. Since the outputs values being detected across the outputs 30 are not expected to change during this programming period, 25,000 redundant test vectors comprising the 25,000 redundant input and 25,000 redundant output vectors will be executed by the logic device tester 50. In addition, since more than only one memory location generally needs to be programmed in order to test an electrically programmable read-only-memory portion of a logic device, the number of redundant test vectors to be executed by the logic device tester 50 when testing the electrically programmable read-only-memory portion of a logic device 10, can easily be in the millions.

Since the logic device tester 50 applies the series of redundant test vectors across the inputs 20 of the logic device 10 on a real time basis, the large number of redundant test vectors does not significantly affect the overall test time for testing the device. Problems occur with such large numbers of input vectors, however, when simulating the logic device 10. Since the simulation period used for the computer simulation of the logic device 10 is generally set equal to the clock cycle of the logic device tester 50 to facilitate the generation of test vectors which form part of the test program, millions of redundant input vectors may typically be provided to the computer simulation for simulating the programming of the electrically programmable read-only-memory portion of the logic device 10. Since both the input and output vectors are not expected to change during this programming period of the electrically programmable read-only-memory portion of the logic device 10, the simulation data (i.e., the test vectors) generated as a result of these millions of redundant input vectors are also redundant. Consequently, computer simulation time and data storage requirements are unnecessarily wasted in computing and storing such redundant information.

If the simulation period could be changed "on the fly", i.e., during the simulation of the programming of the electrically programmable read-only-memory, then the problems arising from such a large number of redundant input and expected output vectors would diminish or disappear by increasing the simulation period. For example, if the simulation period could be changed during a programming period to 25.0 milliseconds, then only one input vector would need to be provided to the computer simulation, not 25,000. However, computer simulations of the type used for generating the test vectors which are in turn used for generating the test programs for testing a logic device 10 on a logic device tester 50, cannot be readily changed, because they are time based simulations, not event driven.

Figure 7:
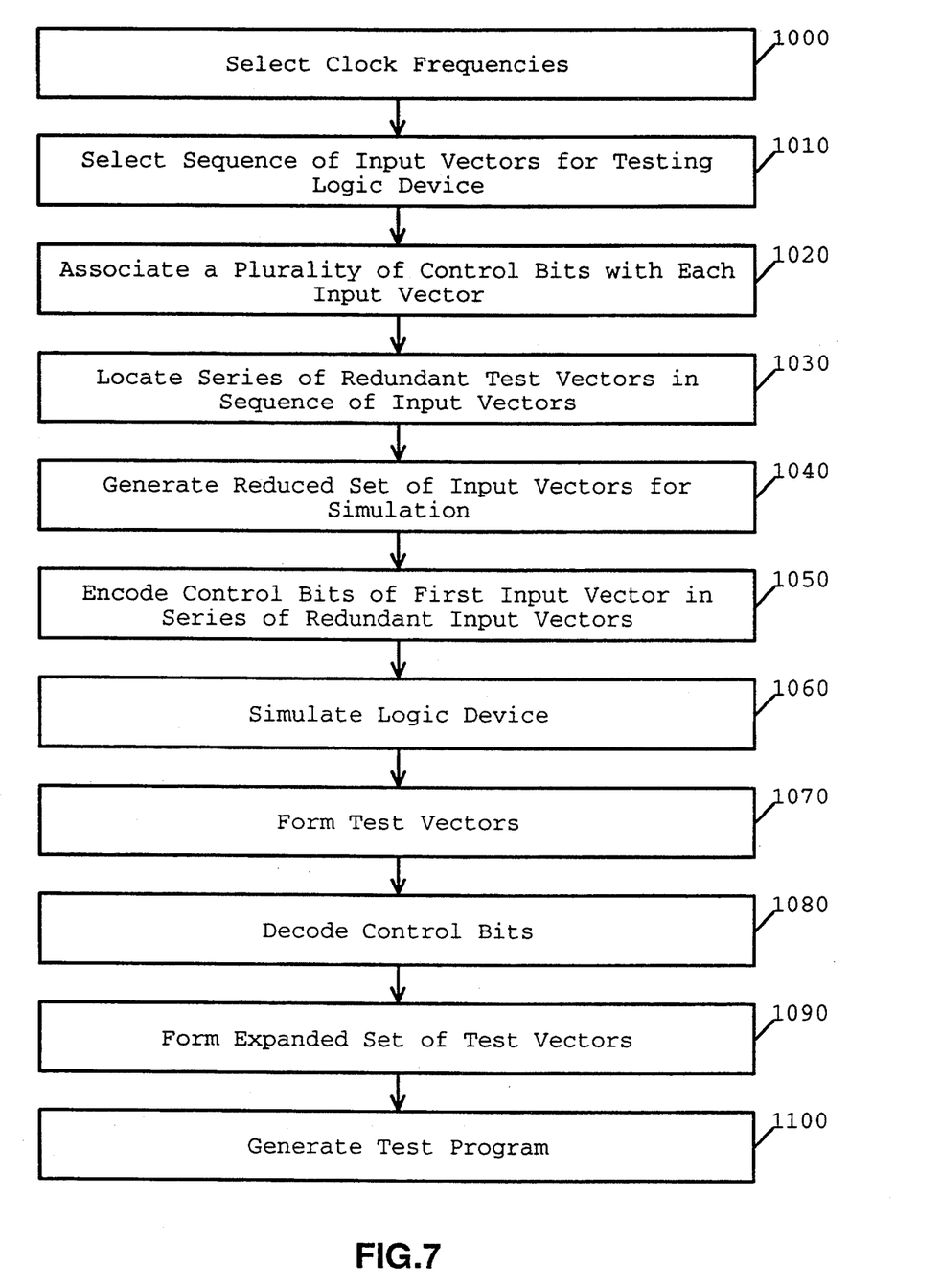
FIG. 7 illustrates a flow chart of a method, utilizing aspects of the present invention, for reducing the simulation time and data storage requirements for a computer simulation of a logic device.

FIG. 7 illustrates a flow chart of a method, utilizing aspects of the present invention, for reducing the simulation time and data storage requirements for a computer simulation of a logic device, where the simulation involves a series of redundant input and expected output vectors such as previously described. The method reduces the simulation time and data storage requirements by compressing the simulation data supplied to the computer simulation. It does this by simulating only the first of a series of redundant test vectors, and not simulating the remainder of the series. In order to subsequently generate the test program for testing the logic device 10, the compressed simulation data is then decompressed or expanded by reading and decoding certain control bits which had been encoded when the simulation data had first been compressed.

Referring now to FIG. 7, in step 1000, a clock frequency (also referred to herein as an "initial operating frequency") for the logic device tester 50 is selected among the selectable clock frequencies of the logic device tester 50, such that it is fast enough to adequately test the logic device 10. In practical experience, this is usually done by a test engineer with or without consultation with the designer of the logic device 10. A simulated clock frequency for the computer simulation of the logic device 10 is then selected in such a fashion that it normally matches the clock frequency for the logic device tester 50 so that the time intervals between each generated output vector matches that of the time intervals between each application of an input vector across the inputs 20 of the logic device 10 by the logic device tester 50, to facilitate comparison of the simulation generated output vectors with the sets of output values being detected across the outputs 30 of the logic device 10 by the logic device tester 50.

In step 1010, a sequence of input vectors is selected for testing the logic device 10 so as to adequately exercise the logic device 10. In practical experience, this is usually done by the designer of the logic device 10 with or without the assistance of special purpose computer software. As an example, a sequence of input vectors may comprise every combination of HIGH and LOW bit patterns across the inputs 20 of the logic device 10. Other combinations are also selectable and may depend upon such factors as whether it is necessary or not to exercise 100% of the digital circuitry in the logic device 10, or whether or not sequential logic exists in the digital circuitry of the logic device 10.

In step 1020 a plurality of control bits (e.g., CB1 and CB2 in FIG. 8B) are associated with each input vector for such encoding purposes as will be described in reference to step 1050. In step 1030, each series of redundant test vectors among the sequence of test vectors selected in step 1010, is generally preidentified by the type of test activity being conducted by the logic device tester 50 on the logic device 10. For example, when an electrically programmable read-only-memory portion of the logic device 10 is being programmed as a first step in testing the electrically programmable read-only-memory by the logic device tester 50, it is known that because of the long programming period of the electrically programmable read-only-memory, a series of redundant input vectors having the same expected output vectors will occur during this programming period.

In step 1040, a reduced set of input vectors is generated for simulation from the sequence of input vectors selected in step 1010, by eliminating all but the first of the redundant input vectors in the series of redundant input vectors having the same expected output vectors (or equivalently, eliminating all but the first test vector of the series of redundant test vectors corresponding to such input and expected output vectors). As an example, FIG. 6 lists an original sequence of test vectors corresponding to times t0 through t9, and FIG. 8b lists a reduced set of input vectors generated from the sequence listed in FIG. 6, by eliminating the redundant test vectors corresponding to times t5 through t7 in FIG. 6.

In step 1050, information on the number of test vectors thus eliminated is then retained for future use by encoding the plurality of control bits (e.g., CB1 and CB2) previously associated with the first test vector of the series of redundant test vectors, in step 1020. The encoding of the control bits (e.g., CB1 and CB2) can either directly indicate the number of redundant input vectors in the series of redundant input vectors or it can indirectly indicate it by the type of activity being conducted during that period by the logic device tester 50 (e.g., programming of the electrically programmable read-only-memory). For example, the encoding of the control bits, CB1 and CB2, with a "1" and a "0", respectively, can either directly indicate the number four which is the number of redundant input vectors in this example, or it can indirectly indicate that the programming of the electrically programmable read-only-memory is being initiated in this step.

Figure 8A:
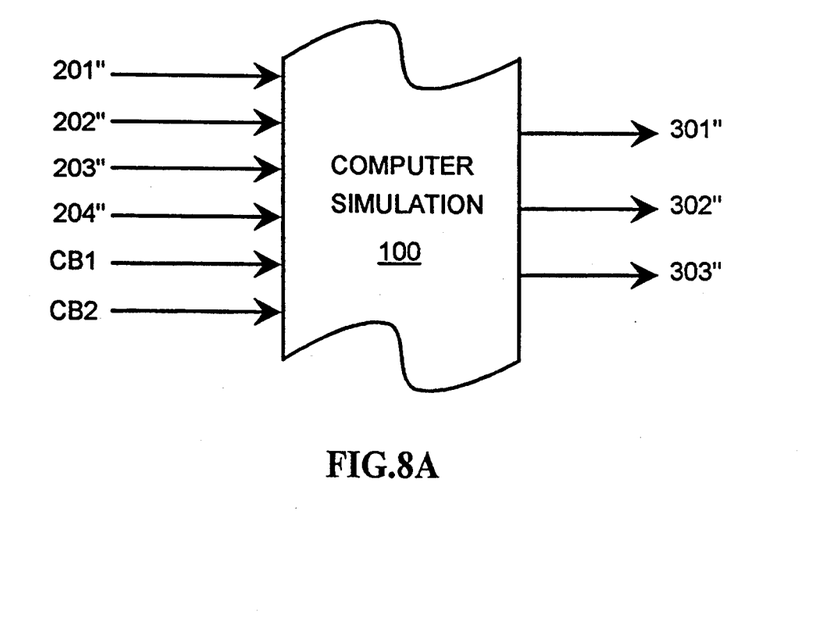
FIGS. 8A-8B illustrate an example of how expected output values are determined and a set of test vectors formed, from a computer simulation utilizing the method illustrated in FIG. 7.
Figure 8B:
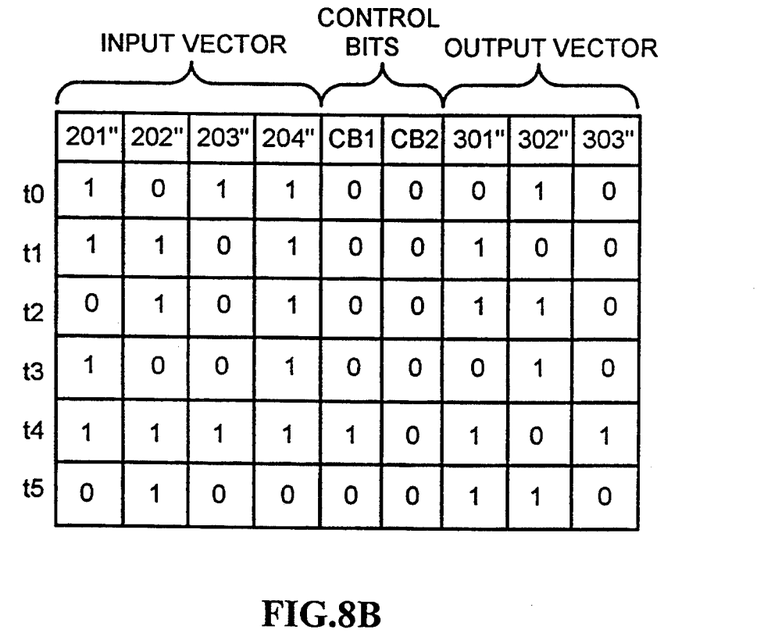

In step 1060, the reduced set of input vectors are then provided to a computer simulation (e.g., 100 in FIG. 8A) of the logic device 10 along with the associated control bits (e.g., CB1 and CB2) of each input vector, as schematically illustrated in FIG. 8A, in order to generate the corresponding expected output vectors for each of those input vectors. In step 1070, a set of test vectors is then formed by combining each input vector of the reduced set of input vectors, including its associated control bits, with its corresponding output vector resulting from the computer simulation. For example, in FIG. 8B, a test vector corresponding to time t0 is formed by combining the input vector comprising the simulated values (e.g., 201″–204″) on each of the inputs (e.g., 201–204) at time t0, with the values of CB1 and CB2 at time t0, and the generated outputs (e.g., 301″–303″) resulting from providing those simulated inputs to the computer simulation 100 of the logic device 10.

Figure 9A:
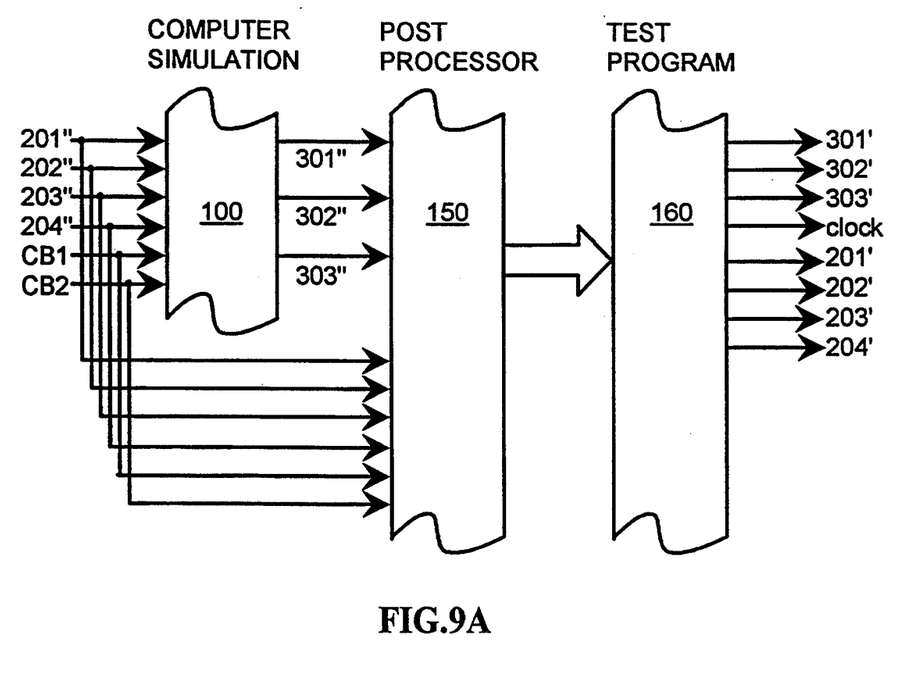
FIGS. 9A-9B illustrate an example of how an expanded set of test vectors is determined from the original set of test vectors formed in the example of FIGS. 8A-8B, and how a test program is then generated from the expanded set of test vectors by utilizing aspects of the present invention.

In step 1080, the control bits in each of the test vectors formed in step 1070 are then scanned in order to locate one or more encoded control bits and once located, the encoded control bits are then decoded. In step 1090, the reduced set of input vectors is then expanded by a post processor (e.g., 150 in FIG. 9A) according to the information contained in the encoded control bits to either form the original sequence of input vectors or some modified sequence of input vectors. For example, normally the original sequence of input vectors is regenerated so that the logic device tester 50 can apply each of the sequence of input vectors at intervals equal to the period corresponding to its previously selected operating frequency.

When the logic device tester 50 can be programmed to change its clock frequency during testing, however, it is often preferable to form a modified sequence of input vectors. For example, by programming the test program (e.g., 160 in FIG. 9A) in step 1100 to cause the clock period of the logic device tester 50 to be doubled (e.g., from 1.0 μsec. to 2.0 μsec.) starting with the first input vector in the series of redundant input vectors, then only half as many redundant input vectors are required to be applied across the inputs 20 of the logic device 10 by the logic device tester 50. This is shown, for example, by comparing FIGS. 6 and 9B, where in FIG. 9B a modified sequence of input vectors starting at time T4′ and ending at time T5′ is applied across the inputs 20 of the logic device 10, each for 2.0 μsec. instead of the 1.0 μsec. that other input vectors are being applied.

Figure 9B:
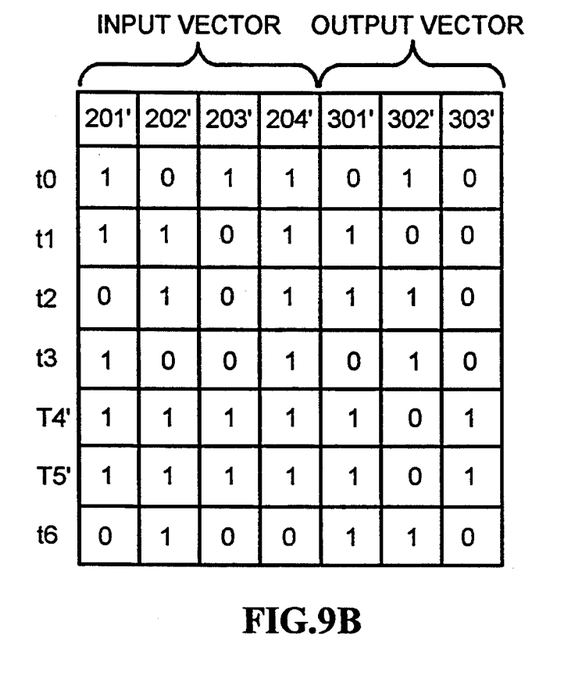

After the series of redundant input vectors have been applied across the inputs 20 of the logic device 10, the test program (e.g., 160 in FIG. 9A) generated in step 1100 can then reset the clock frequency of the logic device tester 50 back to its initial operating frequency (e.g., 1.0 μsec.), as shown, for example, at time t6 in the figure.

Although the various aspects of the present invention have been described with respect to a preferred embodiment, it will be understood that the invention is entitled to full protection within the full scope of the appended claims.

What is claimed is:

1. A method of reducing the simulation time and data storage requirements for a computer simulation of a logic device having a plurality of inputs and outputs, comprising the steps of:

selecting an initial operating frequency for a logic device tester, said initial operating frequency having a corresponding period;

selecting a sequence of input vectors to be applied to said plurality of inputs by said logic device tester for testing said logic device, wherein each input vector is to be applied for a finite duration equal to said period corresponding to said initial operating frequency, before a next input vector in said sequence is applied;

associating a plurality of control bits with each of said sequence of input vectors;

locating a series of redundant input vectors among said sequence of input vectors, wherein each input vector in said series is expected to generate an identical output vector on said plurality of outputs of said logic device;

forming a subset to be provided to said computer simulation, of said sequence of input vectors by eliminating from said sequence of input vectors all but a first input vector of said located series of redundant input vectors;

encoding a plurality of control bits associated with said first input vector of said located series;

providing said computer simulation with said formed subset of input vectors along with the plurality of control bits associated with each input vector in said subset;

causing said computer simulation to generate a set of simulated output vectors in response to said provided subset of input vectors; and forming a set of test vectors, wherein each test vector comprises an input vector from said formed subset of input vectors, a simulated output vector generated by said computer simulation in response to said input vector, and a plurality of control bits associated with said input vector.

2. The method as recited in claim 1, wherein said encoding step comprises the step of encoding said plurality of control bits in such a fashion as to indicate the number of redundant input vectors being eliminated.

3. The method as recited in claim 1, wherein said encoding step comprises the step of encoding said plurality of control bits in such a fashion as to indicate a type of activity being conducted while said series of redundant input vectors are being applied to said plurality of inputs of said logic device by said tester.

4. The method as recited in claim 1, further comprising the steps of:

decoding each of said plurality of control bits associated with said formed set of test vectors, to locate said first input vector of said series of redundant input vectors; and forming an expanded set of test vectors by duplicating said first input vector a predetermined number of times.

5. The method as recited in claim 4, wherein said forming step for said expanded set of test vectors comprises the step of duplicating said first input vector by the number of redundant input vectors in said series of redundant input vectors.

6. The method as recited in claim 4, wherein said expanded set of test vectors forming step comprises the step of duplicating said first input vector by a predetermined number of times, and further comprising the step of generating a test program for said tester that causes said tester to apply each of said input vectors associated with each of said expanded set of test vectors to be successively applied to said plurality of inputs of said logic device for a finite duration, wherein said finite duration is initially set to said minimum period and changed to a longer period during the time that said duplicated input vectors are being applied to said plurality of inputs.

7. The method as recited in claim 6, wherein said test program generating step comprises the step of changing said finite duration to a longer period equal to said minimum period multiplied by the number of redundant input vectors in said series of redundant input vectors and divided by the number of times said first input vector is duplicated.

* * * * *